United States Patent
Ohashi et al.

(10) Patent No.: US 9,502,955 B2
(45) Date of Patent: Nov. 22, 2016

(54) DRIVE CIRCUIT AND SEMICONDUCTOR DEVICE

(71) Applicant: FUJI ELECTRIC CO., LTD., Kawasaki-shi (JP)

(72) Inventors: Hidetomo Ohashi, Matsumoto (JP); Masashi Akahane, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 14/879,500

(22) Filed: Oct. 9, 2015

(65) Prior Publication Data

US 2016/0036315 A1 Feb. 4, 2016

Related U.S. Application Data

(63) Continuation of application No. PCT/JP2014/067038, filed on Jun. 26, 2014.

(30) Foreign Application Priority Data

Sep. 27, 2013 (JP) .................. 2013-201784

(51) Int. Cl.
| | |
|---|---|
| H03K 3/012 | (2006.01) |
| H02M 1/088 | (2006.01) |
| H02M 1/08 | (2006.01) |
| H03K 17/16 | (2006.01) |
| H03K 17/567 | (2006.01) |
| H03K 17/687 | (2006.01) |

(52) U.S. Cl.
CPC .............. *H02M 1/088* (2013.01); *H02M 1/08* (2013.01); *H03K 17/162* (2013.01); *H03K 17/567* (2013.01); *H03K 17/687* (2013.01); *H03K 2217/0063* (2013.01)

(58) Field of Classification Search
USPC ........ 327/108–112, 333, 389, 391, 427, 434, 327/437; 326/63, 68, 80–81
See application file for complete search history.

(56) References Cited

U.S. PATENT DOCUMENTS 6,538,481 B1* 3/2003 Suetsugu .............. H02M 7/538
 327/109
7,274,241 B2* 9/2007 Ho .......................... H02M 1/44
 327/170

(Continued)

FOREIGN PATENT DOCUMENTS

| | | |
|---|---|---|
| JP | 2003-079131 A | 3/2003 |
| JP | 2003-101391 A | 4/2003 |

(Continued)

*Primary Examiner* — An Luu
(74) *Attorney, Agent, or Firm* — Rabin & Berdo, P.C.

(57) ABSTRACT

Malfunction can be reliably avoided even when a signal that drives a high side power device is not normally transmitted in a level shift circuit. In a drive circuit, a pulse generator circuit generates a set signal and reset signal that causes a high side power device to be turned on or off. The pulse generator circuit provides set and reset signals, via a level shift circuit, to a high side drive circuit. A high side potential (a high side reference potential or a high side power supply potential) is detected by a high side potential detector circuit. A high side potential determination circuit determines a change in potential that impedes the transmission of the set signal or reset signal in the level shift circuit, and causes the pulse generator circuit to regenerate the set signal or reset signal when the timing of the detection coincides with the timing at which the set signal or reset signal is generated.

17 Claims, 13 Drawing Sheets

(56) References Cited

U.S. PATENT DOCUMENTS

| | | |
|---|---|---|
| 9,312,845 B2 * | 4/2016 | Akahane .................. H03K 7/08 |
| 9,325,317 B2 * | 4/2016 | Akahane .......... H03K 17/04123 |
| 2003/0016054 A1 | 1/2003 | Okamoto et al. |
| 2003/0048116 A1 | 3/2003 | Suetsugu |
| 2005/0088227 A1 | 4/2005 | Sakata |
| 2007/0210780 A1 | 9/2007 | Kataoka |

FOREIGN PATENT DOCUMENTS

| | | |
|---|---|---|
| JP | 2004-120152 A | 4/2004 |
| JP | 2005-130355 A | 5/2005 |
| JP | 2007-243254 A | 9/2007 |

* cited by examiner

DRIVE CIRCUIT AND SEMICONDUCTOR DEVICE

CROSS-REFERENCE TO RELATED APPLICATION

This application is a continuation of International Application PCT/JP2014/067038 filed on Jun. 26, 2014, and claims priority to, Japanese Patent Application No. 2013-201784, filed on Sep. 27, 2013, the contents of both of which are entirely incorporated herein by reference for all purposes.

BACKGROUND

1. Technical Field

The present disclosure relates to a drive circuit and semiconductor device, and in particular, relates to a drive circuit and semiconductor device that drives a high side power device of two power devices connected in a totem pole configuration.

2. Description of Related Art

A circuit configuration wherein power devices are connected in a totem pole configuration, and each of the high side and low side power devices is driven by a drive circuit, is employed in an inverter or converter. An HV driver IC (HVIC) is known as a high side drive circuit.

An HV driver IC includes a pulse generator circuit that generates a signal causing the high side power device to be turned on or off, a level shift circuit, and a high side drive circuit that drives the high side power device in accordance with a signal transmitted via the level shift circuit. The level shift circuit shifts the level of a signal generated with the ground potential as a reference by the pulse generator circuit, and transmits the signal to the high side drive circuit installed on the high side. At this time, a signal of an amplitude that varies between the ground potential and the high side power supply potential of the HV driver IC is generated in the level shift circuit. The high side drive circuit receives voltage of that kind of amplitude, and carries out a drive that turns the high side power device on or off.

Herein, a connection point of the low side power device and high side power device, that is, a midpoint of the totem pole, is connected to a load. Therefore, external noise caused by load and parasitic inductance may be superimposed on the totem pole midpoint. At such a time, the totem pole midpoint potential is in an overshooting or undershooting state, because of which the totem pole midpoint potential reaches a potential equal to or greater than a high-voltage potential of the high side power device, or reaches a potential equal to or lower than the ground potential.

In the event that a signal is output from the pulse generator circuit at a timing at which the totem pole midpoint potential becomes lower than the ground potential, the level shift circuit is unable to transmit the signal normally to the high side drive circuit. In this case, the high side power device cannot be turned off at a timing at which it should be turned off, thus remaining in an on-state, or cannot be turned on at a timing at which it should be turned on, thus remaining in an off-state, and the true switching function cannot be maintained.

Herein, there is technology responding to being unable to turn off the high side power device at a timing at which it should be turned off (for example, JP-A-2004-120152), and technology responding to being unable to turn on the high side power device at a timing at which it should be turned on (for example, JP-A-2005-130355). According to the technology of JP-A-2004-120152, a second turn-off pulse signal is output after the elapse of a predetermined time from a first turn-off pulse signal being output. Therefore, even when the first turn-off pulse signal cannot be transmitted normally through the level shift circuit, the second turn-off pulse signal can be transmitted normally through the level shift circuit. Similarly, the technology of JP-A-2005-130355 is such that a second turn-on pulse signal is output after the elapse of a predetermined time from a first turn-on pulse signal being output. Therefore, even when the first turn-on pulse signal cannot be transmitted normally through the level shift circuit, the second turn-on pulse signal can be transmitted normally through the level shift circuit.

SUMMARY

However, the existing technology is simply such that a second turn-off or turn-on pulse signal is mechanically output after the elapse of a predetermined time from a first turn-off or turn-on pulse signal being output. Therefore, as there is a possibility of new external noise occurring at the point at which the predetermined time elapses, a problem essentially remains in that malfunction cannot be completely avoided.

The disclosure, having been contrived with this kind of problem in mind, provides a drive circuit and semiconductor device such that malfunction can be reliably avoided even when a signal that causes a high side power device to switch to an off-state or on-state cannot be normally transmitted in a level shift circuit.

The disclosure is such that a drive circuit is provided in order to resolve the described problem. The drive circuit includes a high side drive circuit that drives a high side power device, a pulse generator circuit that generates a set signal causing the high side power device to be turned on and a reset signal causing the high side power device to be turned off based on a first edge and second edge of a logic input signal input from the exterior, a level shift circuit that transmits the set signal and reset signal to the high side drive circuit, a high side potential detector circuit that detects high side potential, and a high side potential determination circuit that outputs an event signal based on a change in the high side potential detected by the high side potential detector circuit, wherein the pulse generator circuit regenerates the reset signal in accordance with the event signal output by the high side potential determination circuit and the logic input signal input from the exterior.

Also, the disclosure provides a semiconductor device including the drive circuit. According to this implementation, the high side potential determination circuit outputs an event signal based on a change in high side potential, and a reset signal is generated again in accordance with the event signal and a logic input signal input from the exterior. Therefore, a high side power device that should have shifted to an off-state can be reliably controlled so as to shift to an off-state.

The drive circuit and semiconductor device of the described configuration are such that a reset signal is regenerated by determining a case wherein a level shift circuit cannot normally transmit a set or reset signal that causes a high side power device to switch to an on-state or off-state, because of which malfunction can be mechanically prevented. Also, regeneration of a set signal can also be enabled in the same way, and malfunction can thus be mechanically prevented.

The described characteristics of the disclosure will be made clear by the following description related to the attached drawings.

DETAILED DESCRIPTION

Figure 1:
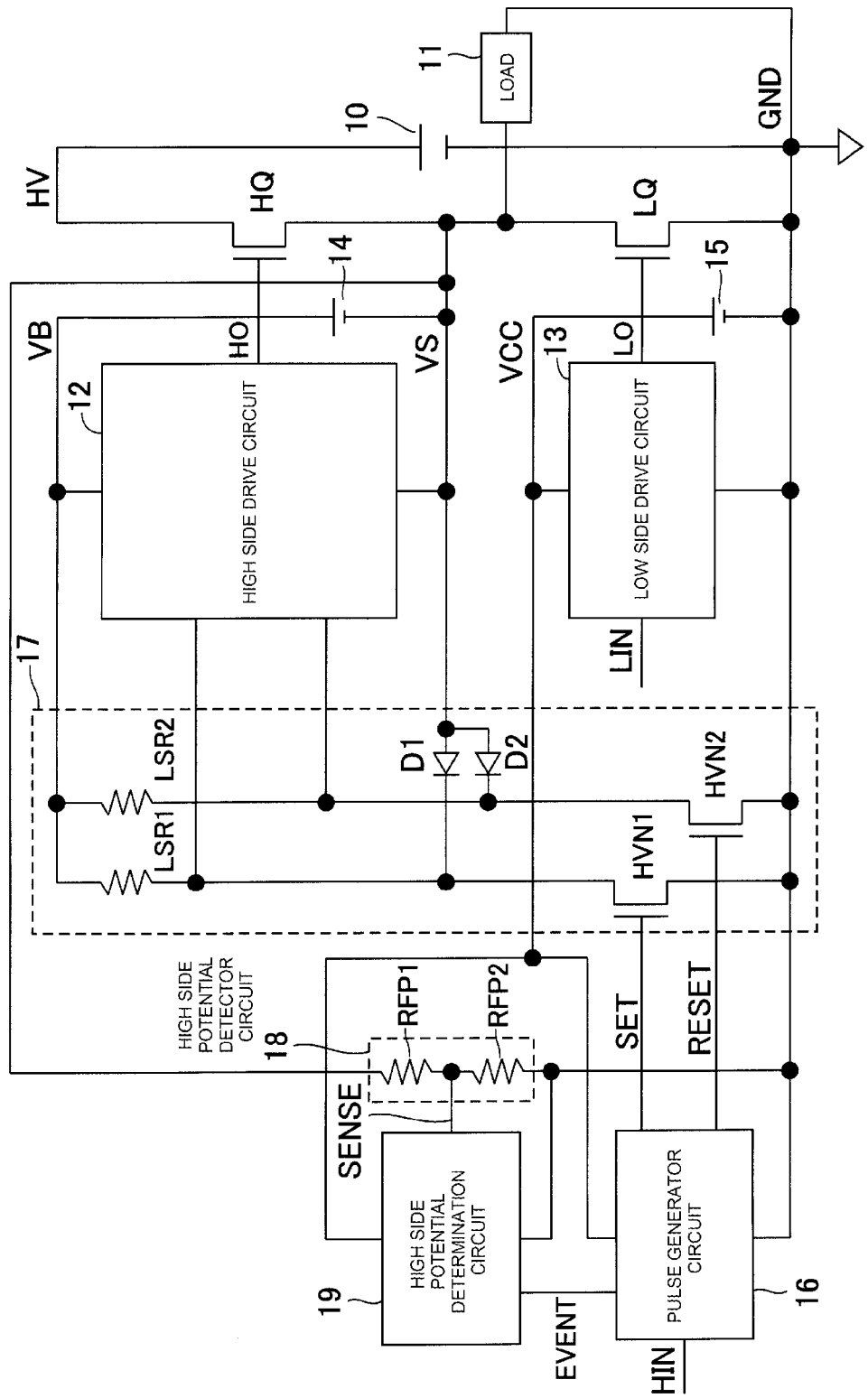
FIG. 1 is a circuit diagram showing a semiconductor device according to a first embodiment.

Hereafter, referring to the drawings, a detailed description will be given, with a case where the disclosure is applied to an HV driver IC as an example. Each embodiment can be implemented by combining a multiple of embodiments as appropriate within a consistent range.

Figure 2:
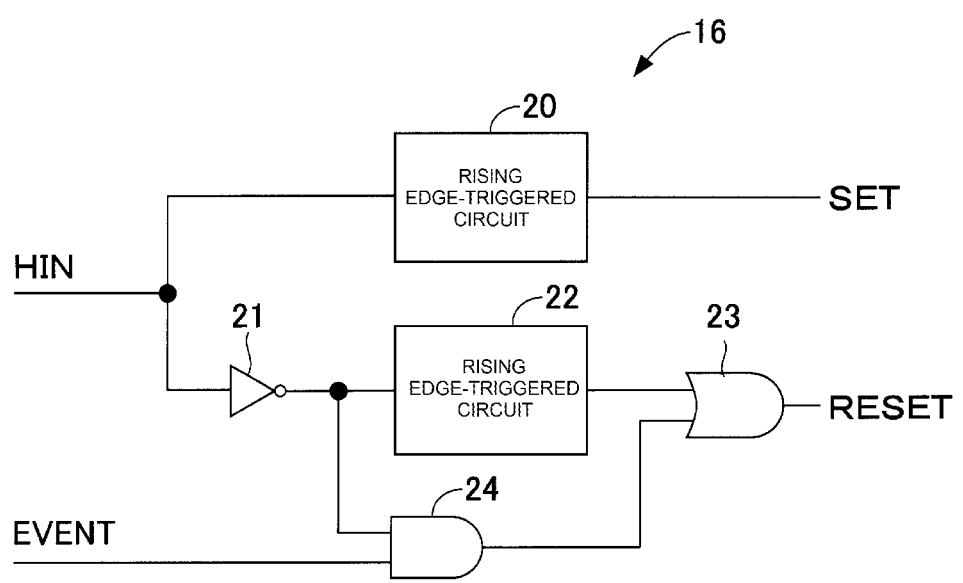
FIG. 2 is a circuit diagram showing an example of a pulse generator circuit.
Figure 3:
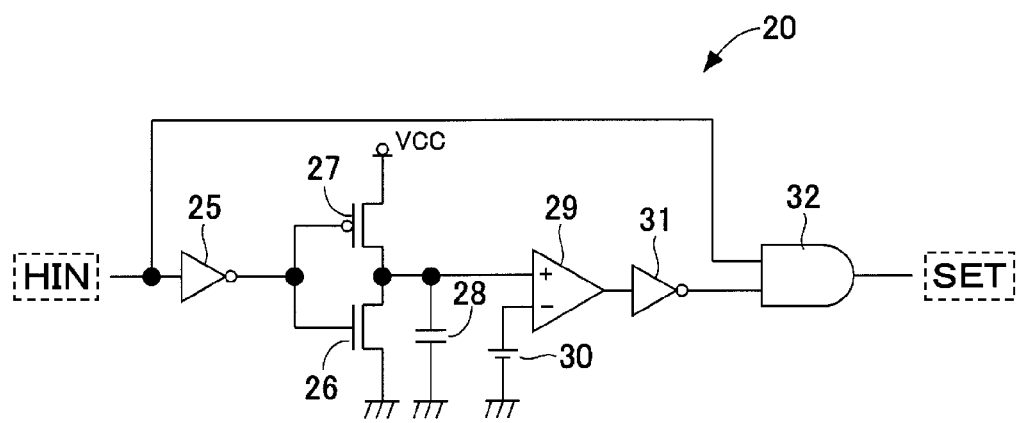
FIG. 3 is a circuit diagram showing an example of a rising edge-triggered circuit.
Figure 4:
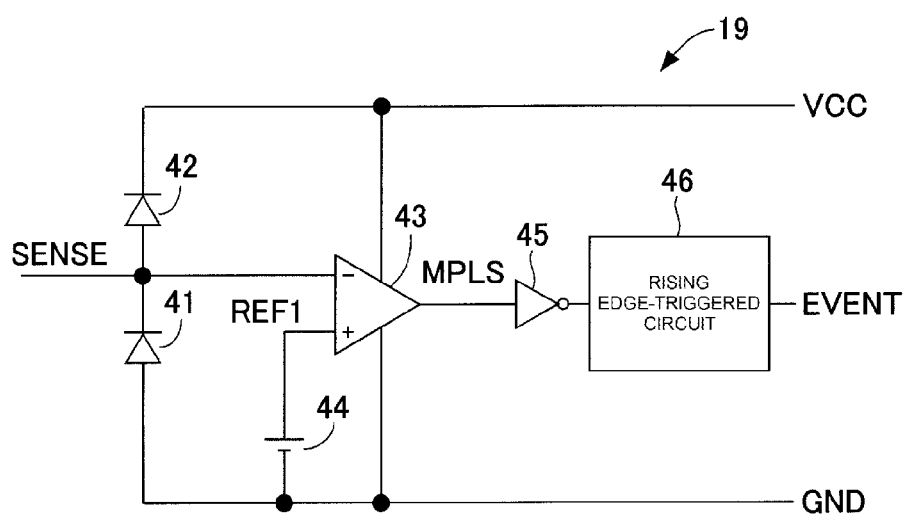
FIG. 4 is a circuit diagram showing an example of a high side potential determination circuit.

FIG. 1 is a circuit diagram showing a semiconductor device according to a first embodiment, FIG. 2 is a circuit diagram showing an example of a pulse generator circuit, FIG. 3 is a circuit diagram showing an example of a rising edge-triggered circuit, and FIG. 4 is a circuit diagram showing an example of a high side potential determination circuit.

The semiconductor device according to the first embodiment has a high side power device HQ and low side power device LQ connected in a totem pole configuration, as shown in FIG. 1. In the embodiment, each of the high side power device HQ and low side power device LQ is configured of a power MOS transistor, but may equally well be another device, such as an IGBT (Insulated Gate Bipolar Transistor). The drain of the high side power device HQ is connected to a positive electrode terminal of a high voltage power supply 10, while the source of the low side power device LQ and a negative electrode terminal of the high voltage power supply 10 are connected to a ground GND. The source of the low side power device LQ may be connected to the ground GND via a resistor. A connection point of the source of the high side power device HQ and the drain of the low side power device LQ, that is, a midpoint of the totem pole, is connected to a load 11.

The gate of the high side power device HQ is connected to an output terminal HO (a high side output signal, which is a potential signal of the output terminal HO, is also referred to as HO) of a high side drive circuit 12, while the gate of the low side power device LQ is connected to an output terminal LO of a low side drive circuit 13. The high side drive circuit 12 is configured such that a reference potential terminal is connected to a midpoint of the totem pole and a negative electrode terminal of a high side power supply 14, while a power supply terminal is connected to a positive electrode terminal of the high side power supply 14. The low side drive circuit 13 is configured such that a reference potential terminal thereof is connected to the ground GND and a negative electrode terminal of a low side power supply 15, while a power supply terminal is connected to a positive electrode terminal of the low side power supply 15. Herein, a low side power supply potential is shown as VCC, which has the ground GND as a reference, while a high side reference potential and high side power supply potential are shown as VS and VB respectively, which have the ground GND as a reference.

The semiconductor device also includes a pulse generator circuit 16, a level shift circuit 17, a high side potential detector circuit 18, and a high side potential determination circuit 19.

The pulse generator circuit 16 receives a high side control logic input signal HIN from the exterior, and generates a set signal SET and reset signal RESET. Specifically, the pulse generator circuit 16 includes a rising edge-triggered circuit 20 that receives the high side control logic input signal HIN and outputs the set signal SET, as shown in FIG. 2. The pulse generator circuit 16 also includes an inverter 21, a rising edge-triggered circuit 22, an OR circuit 23, and an AND circuit 24. The input of the inverter 21 is connected to an input terminal of the high side control logic input signal HIN, while the output of the inverter 21 is connected to the input of the rising edge-triggered circuit 22 and one input of the AND circuit 24. The output of the rising edge-triggered circuit 22 is connected to one input of the OR circuit 23, while the output of the OR circuit 23 outputs the reset signal RESET. The other input of the AND circuit 24 is connected to an output terminal of the high side potential determination circuit 19 to receive an event signal EVENT, while the output of the AND circuit 24 is connected to the other input of the OR circuit 23.

The rising edge-triggered circuit 20 includes an inverter 25 whose input is connected to the input terminal of the high side control logic input signal HIN, as shown in FIG. 3. The output of the inverter 25 is connected to the gates of an NMOS transistor 26 and PMOS transistor 27. The source of the NMOS transistor 26 is connected to the ground GND, while the drain of the NMOS transistor 26 is connected to the drain of the PMOS transistor 27. The source of the PMOS transistor 27 is connected to the positive electrode terminal of the low side power supply 15, which supplies the low side power supply potential VCC. The output of an inverter circuit formed of the NMOS transistor 26 and PMOS transistor 27 is connected to one end of a capacitor 28, while the other end of the capacitor 28 is connected to the ground GND. The output of the inverter circuit is also connected to one input of a comparator 29. A positive electrode terminal of a reference voltage supply 30 is connected to the other input of the comparator 29, while a negative electrode terminal of the reference voltage supply 30 is connected to the ground GND. The output of the comparator 29 is connected to the input of an inverter 31, the output of the inverter 31 is connected to one input of an AND circuit 32, and the other input of the AND circuit 32 is connected to the input terminal of the logic input signal HIN. The output of the AND circuit 32 configures an output terminal that outputs the set signal SET.

Although a description has been given of a specific example of the rising edge-triggered circuit 20, the rising edge-triggered circuit 22 also has the same configuration. Consequently, FIG. 3 is referred to in the following description of an operation of the rising edge-triggered circuit 22. The input of the rising edge-triggered circuit 22 is a signal wherein the logic of the high side control logic input signal HIN is inverted, while the output forms the reset signal RESET via the OR circuit 23. Also, the pulse generator circuit 16 has the high side control logic input signal HIN from the exterior as an input, but a low side control logic input signal LIN is input directly into the low side drive circuit 13 from the exterior.

The level shift circuit 17 has high breakdown voltage MOS transistors HVN1 and HVN2, resistors LSR1 and LSR2, and clamping diodes D1 and D2. The gates of the MOS transistors HVN1 and HVN2 are respectively connected to the set signal SET output terminal and reset signal RESET output terminal of the pulse generator circuit 16. The drains of the MOS transistors HVN1 and HVN2 are respectively connected to one end of the resistors LSR1 and LSR2, while the other ends of the resistors LSR1 and LSR2 are connected to the power supply terminal of the high side drive circuit 12. Connection points of the drains of the MOS transistors HVN1 and HVN2 and the resistors LSR1 and LSR2 are each connected to an input terminal of the high side drive circuit 12, and are respectively connected to cathode terminals of the diodes D1 and D2. Anode terminals of the diodes D1 and D2 are connected to a midpoint of the totem pole. The sources of the MOS transistors HVN1 and HVN2 are connected to the ground GND.

The high side potential detector circuit 18 detects a high side potential, the high side reference potential VS in the example shown, and in this embodiment, a resistant field plate (RFP) is utilized as detection means. The resistant field plate is formed with the object of electrical field relaxation at a voltage withstand region HVJT (High Voltage Junction Terminal) in a high side circuit high withstand voltage region device (for example, refer to International Publication No. 2013/069408). The high side potential detector circuit 18 is divided into two resistors RFP1 and RFP2 by providing a branch point in the resistant field plate, wherein one terminal is connected to a midpoint of the totem pole, while the other terminal is connected to the ground GND. The branch point of the resistant field plate is connected to an input terminal of the high side potential determination circuit 19, and outputs a detection signal SENSE representing a change in the high side reference potential VS.

The high side potential determination circuit 19 receives the detection signal SENSE detected by the high side potential detector circuit 18, and generates the signal EVENT for determining whether or not the high side potential, herein the high side reference potential VS, is being affected by external noise and changing. The high side potential determination circuit 19 includes two protective diodes 41 and 42, a comparator 43, a reference voltage supply 44, an inverter 45, and a rising edge-triggered circuit 46, as shown in FIG. 4. Also, the high side potential determination circuit 19 is installed together with the high side potential detector circuit 18 on the low side potential side, which has the potential of the ground GND as a reference.

An input terminal of the detection signal SENSE is connected to the cathode of the protective diode 41, the anode of the protective diode 42, and one input of the comparator 43. The anode of the protective diode 41 is connected to the ground GND, while the cathode of the protective diode 42 is connected to the low side power supply potential VCC. The other input of the comparator 43 is connected to a positive electrode terminal of the reference voltage supply 44, while a negative electrode terminal of the reference voltage supply 44 is connected to the ground GND. The output of the comparator 43 is connected via the inverter 45 to the input of the rising edge-triggered circuit 46, while the output of the rising edge-triggered circuit 46 configures an output terminal that outputs the event signal EVENT. The rising edge-triggered circuit 46 has the same circuit configuration as the rising edge-triggered circuit 20 shown in FIG. 3, and consequently, FIG. 3 is referred to in the following description of an operation of the rising edge-triggered circuit 46. At this time, the input of the rising edge-triggered circuit 46 is a signal where an output signal MPLS of the comparator 43 is inverted, while the output forms the event signal EVENT.

Next, a description will be given of an operation of the semiconductor device having the heretofore described configuration.

Figure 5:
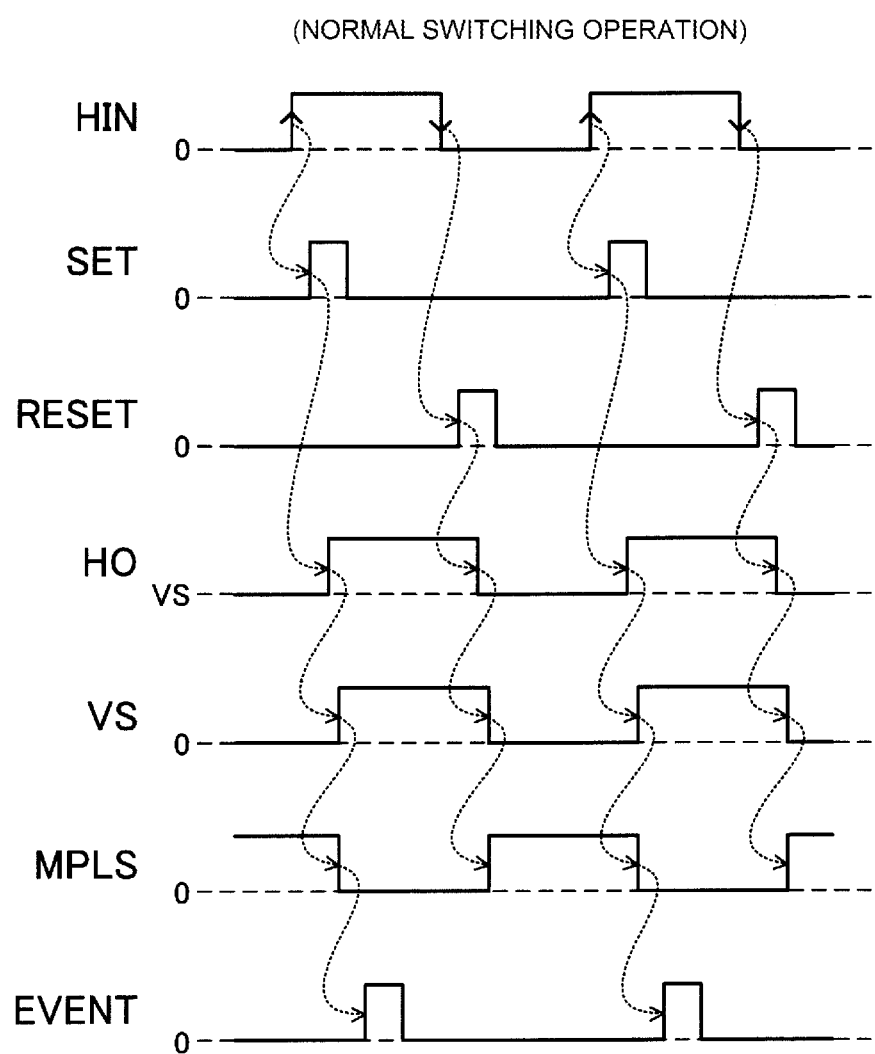
FIG. 5 is a diagram showing main portion waveforms at a time of a normal switching operation of the semiconductor device.
Figure 6:
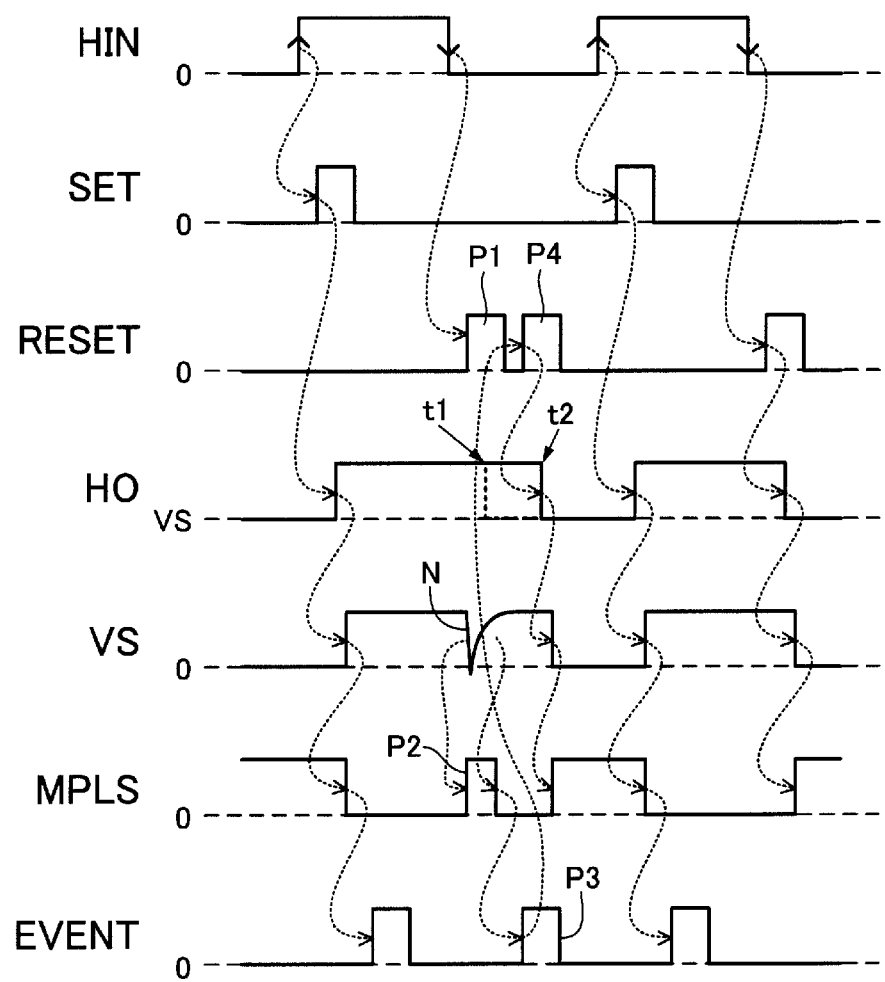
FIG. 6 is a diagram showing main portion waveforms of a switching operation of the semiconductor device affected by external noise.

FIG. 5 is a diagram showing main portion waveforms at a time of a normal switching operation of the semiconductor device, while FIG. 6 is a diagram showing main portion waveforms of a switching operation of the semiconductor device affected by external noise.

First, the high side control logic input signal HIN is input into the pulse generator circuit 16, and the low side control logic input signal LIN is input into the low side drive circuit 13. The high side control logic input signal HIN and low side control logic input signal LIN are such that dead time is set in order that the high side power device HQ and low side power device LQ are not simultaneously in an on-state.

In response to the high side control logic input signal HIN being input, the rising edge-triggered circuit 20, uses the rising edge of the high side control logic input signal HIN as a trigger, and outputs the set signal SET in the pulse generator circuit 16 (refer to SET in FIG. 5, which switches to a high (H) level in response to the rising edge of HIN). That is, in the rising edge-triggered circuit 20 of FIG. 3, the output of the inverter 25 is at the H level when the high side control logic input signal HIN is at a low (L) level, and the NMOS transistor 26 is in an on-state (the PMOS transistor 27 is in an off-state). Therefore, the charge of the capacitor 28 is released, because of which the output of the comparator 29 is at the L level and the output of the inverter 31 is at the H level, but in response to the high side control logic input signal HIN being at the L level, the AND circuit 32 outputs the set signal SET at the L level. In response to the high side control logic input signal HIN switching to the H level, the AND circuit 32, which receives the H level from the inverter 31, outputs the set signal SET at the H level. At this time, the output of the inverter 25 is at the L level, the PMOS transistor 27 is in an on-state (the NMOS transistor 26 is in an off-state), and the capacitor 28 is charged. On the charging potential of the capacitor 28 exceeding the potential of the reference voltage supply 30 after a predetermined time determined in accordance with the capacitance and the like of the capacitor 28, the output of the comparator 29 switches to the H level, and the output of the inverter 31 switches to the L level. Therefore, the AND circuit 32 blocks the H level high side control logic input signal HIN, and outputs the set signal SET at the L level. That is, the set signal SET is output as a pulse signal having a predetermined time span.

In response to the set signal SET being output, the MOS transistor HVN1 of the level shift circuit 17 switches to an on-state, and in response to a voltage drop at the connection point of the resistor LSR1 and MOS transistor HVN1 being detected by the high side drive circuit 12, the high side output signal HO switches from the high side reference potential VS to a high potential state. Therefore, the high side power device HQ shifts to an on-state (at this time, the low side power device LQ is in an off-state), the high side reference potential VS increases, and current is supplied to the load 11.

Meanwhile, in response to the high side control logic input signal HIN switching from the H level to the L level, the rising edge-triggered circuit 22, uses the rising edge of the high side control logic input signal HIN inverted by the inverter 21 as a trigger, and outputs the reset signal RESET in the pulse generator circuit 16. That is, the pulse generator circuit 16 generates the reset signal RESET with the falling edge of the high side control logic input signal FIN as a trigger, as shown in FIG. 5, and the reset signal RESET is output via the OR circuit 23.

In response to the H level reset signal RESET being output, the MOS transistor HVN2 of the level shift circuit 17 switches to an on-state, and on a voltage drop at the connection point of the resistor LSR2 and MOS transistor HVN2 being detected by the high side drive circuit 12, the high side output signal HO returns to the high side reference potential VS. Therefore, the high side power device HQ switches to an off-state, and the high side reference potential VS becomes a potential in accordance with the state of the low side power device LQ. That is, the high side reference potential VS drops to the level of the ground GND at the point at which the low side power device LQ shifts to an on-state.

During a normal switching operation, the high side potential determination circuit 19 (refer to FIG. 4) monitors change in the high side reference potential VS, and outputs the event signal EVENT in response to the absolute value of the high side reference potential VS exceeding a reference potential REF1 of the reference voltage supply 44.

That is, in response to the high side reference potential VS being at the level of the ground GND, the detection signal SENSE is input into the high side potential determination circuit 19 at 0 volts, and the output signal MPLS of the comparator 43 is at the H level. Therefore, the output of the inverter 45 is at the L level, and the rising edge-triggered circuit 46 outputs the event signal EVENT at the L level using the AND circuit 32 (refer to FIG. 3) disposed in the output stage of the rising edge-triggered circuit 46.

In response to the high side potential detector circuit 18 detecting the rising edge of the high side reference potential VS, and the detection signal SENSE being input into the high side potential determination circuit 19 at the H level, when this state exists, the output signal MPLS of the comparator 43 switches to the L level. Therefore, the output of the inverter 45 shifts to the H level, this is detected by the rising edge-triggered circuit 46, and a pulse signal of a predetermined time span is output as the event signal EVENT. Note that, as the output of the inverter 21 is at the L level, the event signal EVENT generated while the high side control logic input signal HIN is at the H level has no involvement with the control of the high side power device HQ.

Next, a description will be given of a case wherein the high side reference potential VS is affected by external noise. In the example of FIG. 6, a description will be given of a case wherein there is an intrusion of external noise at the timing at which the reset signal RESET is output, the high side reference potential VS drops to or below the level of the ground GND, and the reset signal RESET cannot be normally transmitted to the high side drive circuit 12.

First, in response to the high side control logic input signal HIN being input into the pulse generator circuit 16, the set signal SET is generated using the rising edge of the high side control logic input signal HIN as a trigger, and the set signal SET is transmitted via the level shift circuit 17 to the high side drive circuit 12. Therefore, the high side power device HQ switches to an on-state, the high side reference potential VS increases, the change is detected by the high side potential detector circuit 18 and high side potential determination circuit 19, and the event signal EVENT is generated. The operation thus far is the same as in the case of the normal switching operation described referring to FIG. 4.

Next, in response to the high side control logic input signal HIN switching to the L level, the reset signal RESET (pulse P1 of FIG. 6) is generated using the falling edge of the high side control logic input signal HIN as a trigger. Normally, the reset signal RESET is transmitted via the level shift circuit 17 to the high side drive circuit 12, and the high side output signal HO forms a signal that causes the high side power device HQ to shift to an off-state at a time t1, as shown by the broken line in FIG. 6.

Herein, consideration will be given to a case wherein external noise N invades the midpoint of the totem pole at the timing at which the reset signal RESET is generated, and the high side reference potential VS becomes a potential lower than the level of the ground GND. In this case, since the potential of the connection point of the resistor LSR2 and MOS transistor HVN2 cannot drop lower than the output potential of an unshown reference power supply (which outputs voltage with the high side reference potential VS as a reference) provided in the high side drive circuit 12, in order to determine the potential of the connection point, the level shift circuit 17 cannot transmit the reset signal RESET normally to the high side drive circuit 12, and the high side power device HQ continues to be in an on-state.

At this time, the high side potential determination circuit 19 monitors the high side reference potential VS detected by the high side potential detector circuit 18. Herein, when the high side reference potential VS drops once then recovers, the comparator 43 generates the output signal MPLS (a pulse P2 of FIG. 6) in the high side potential determination circuit 19. The output signal MPLS, after the logic thereof is inverted in the inverter 45, is supplied to the rising edge-triggered circuit 46, and the event signal EVENT (a pulse P3 of FIG. 6) of a predetermined time span is generated with the fall of the output signal MPLS as a trigger. The event signal EVENT is supplied to the pulse generator circuit 16, and the reset signal RESET is generated again in the pulse generator circuit 16. That is, the L level high side control logic input signal FIN is input into the logic input terminal of the pulse generator circuit 16 of FIG. 2, while the H level event signal EVENT is input into the input terminal that receives a signal from the high side potential determination circuit 19. At this time, as the H level high side control logic input signal HIN, whose logic has been inverted by the inverter 21, and the H level event signal EVENT are input into the AND circuit 24, the reset signal RESET (a pulse P4 of FIG. 6) is output via the OR circuit 23.

Since the state of the high side reference potential VS has recovered in response to the reset signal RESET (pulse P4) being generated, the state where the level shift circuit 17 can transmit the reset signal RESET (pulse P4) normally to the high side drive circuit 12 has returned. Consequently, the high side drive circuit 12 receives the transmitted reset signal RESET (pulse P4), switches the high side output signal HO to the high side reference potential VS at a time t2, and switches the high side power device HQ to an off-state. The subsequent operation of FIG. 6 is the same as that described using FIG. 5.

In this way, when there is a problem with signal transmission from the level shift circuit 17 when the high side power device HQ has to shift to an off-state, the pulse generator circuit 16 determines that there is a signal transmission problem using the event signal EVENT and high side control logic input signal HIN, and regenerates the reset signal RESET. Moreover, as determination in the high side potential determination circuit 19 is such that a change in potential in the direction in which the high side reference potential VS normally returns is detected and the event signal EVENT generated, the subsequently regenerated reset signal RESET can be reliably transmitted to the high side drive circuit 12. Therefore, although there is a slight delay with respect to the original timing of shifting to an off-state, the high side power device HQ can be reliably switched to an off-state.

Since the event signal EVENT is not involved in the generation of the set signal SET, it is also clear from FIG. 2, the pulse generator circuit 16 generates the set signal SET in response to the high side control logic input signal HIN being at the H level. Also, the reset signal RESET is generated in response to the high side control logic input signal HIN falls from the H level to the L level, and also generated in response to the event signal EVENT being input. When the high side control logic input signal HIN rises from the L level to the H level and the event signal EVENT is being input, the AND circuit 24 blocks the input of the event signal EVENT, and the reset signal RESET is not generated, because of which the high side control logic input signal HIN is given priority, and the set signal SET is generated.

Figure 7:
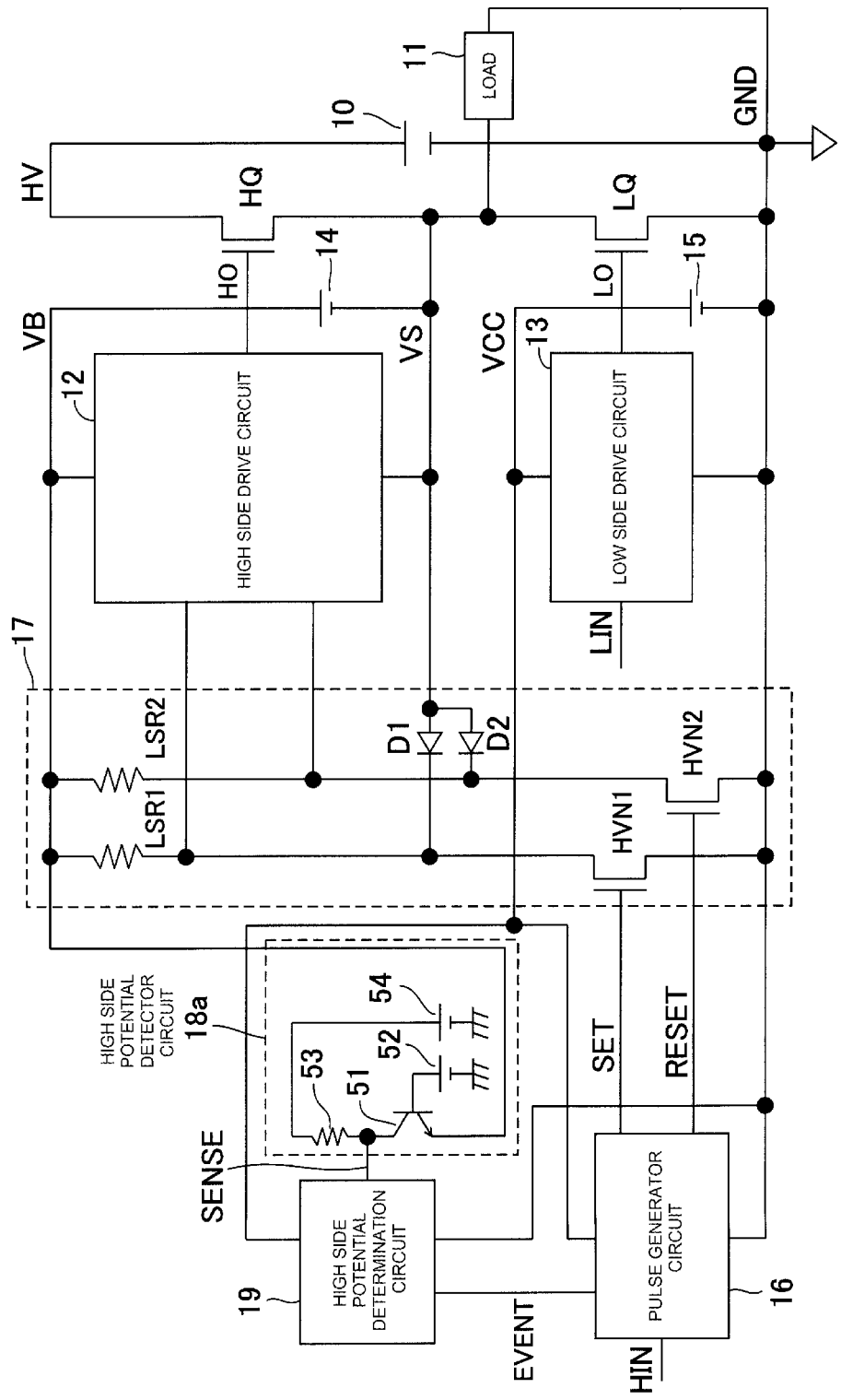
FIG. 7 is a circuit diagram showing a semiconductor device according to a second embodiment.

FIG. 7 is a circuit diagram showing a semiconductor device according to a second embodiment. In FIG. 7, the same reference signs are given to components the same as or equivalent to components shown in FIG. 1, and a detailed description thereof will be omitted.

According to the semiconductor device according to the second embodiment, the configuration of, and the high side potential attempted to be detected by, a high side potential detector circuit 18*a* are changed in comparison with the semiconductor device according to the first embodiment. That is, the high side potential detector circuit 18*a* has as a detection target the high side power supply potential VB as the high side potential. The high side power supply potential VB is a potential that is the high side reference potential VS shifted by an amount equivalent to the potential of the high side power supply 14 and, tracking the high side reference potential VS, changes in the same way. Consequently, the high side potential detector circuit 18*a*, even though monitoring the high side power supply potential VB, is effectively monitoring the high side reference potential VS.

The high side potential detector circuit 18*a* has an NPN-type bipolar transistor 51, and the emitter of the bipolar transistor 51 is connected to a line of the high side power supply potential VB. The base of the bipolar transistor 51 is connected to a positive electrode terminal of a voltage supply 52, while a negative electrode terminal of the voltage supply 52 is connected to the ground GND. The collector of the bipolar transistor 51 is connected to one end of a resistor 53, the other end of the resistor 53 is connected to a positive electrode terminal of a voltage supply 54, and a negative electrode terminal of the voltage supply 54 is connected to the ground GND. The collector of the bipolar transistor 51 configures the output of the high side potential detector circuit 18*a*, and outputs the detection signal SENSE. The bipolar transistor 51 is such that a base-to-emitter potential Vbe thereof has reverse breakdown voltage corresponding to the high breakdown voltage of the high side circuit.

According to the described configuration, when the high side reference potential VS fluctuates, the high side power supply potential VB fluctuates in conformity with the high side reference potential VS, and this is detected by the bipolar transistor 51. That is, normally, even when the high side power supply potential VB has dropped furthest, the potential of the high side power supply 14, which is higher than the potential of the voltage supply 52, is applied to the emitter of the bipolar transistor 51. Therefore, the bipolar transistor 51 is in an off-state, and a signal of the level of the potential of the voltage supply 54 is output as the detection signal SENSE.

When the high side reference potential VS fluctuates, and the high side power supply potential VB further drops beyond a potential obtained by subtracting the base-to-emitter forward potential of the bipolar transistor 51 from the potential of the voltage supply 52, the bipolar transistor 51 shifts to an on-state. Therefore, the high side potential detector circuit 18*a* outputs the detection signal SENSE at the L level.

In this embodiment, the configuration is such that a drop in the high side power supply potential VB is detected by the NPN-type bipolar transistor 51, but it is also possible to use a PNP-type bipolar transistor. That is, when configuring so as to switch to an on-state or off-state in response to the high side power supply potential VB changing from the potential of the positive electrode terminal of the voltage supply 52, with a potential wherein the base-to-emitter forward potential of the PNP-type bipolar transistor is added as a boundary, detection may be carried out in the PNP-type bipolar transistor.

Figure 8:
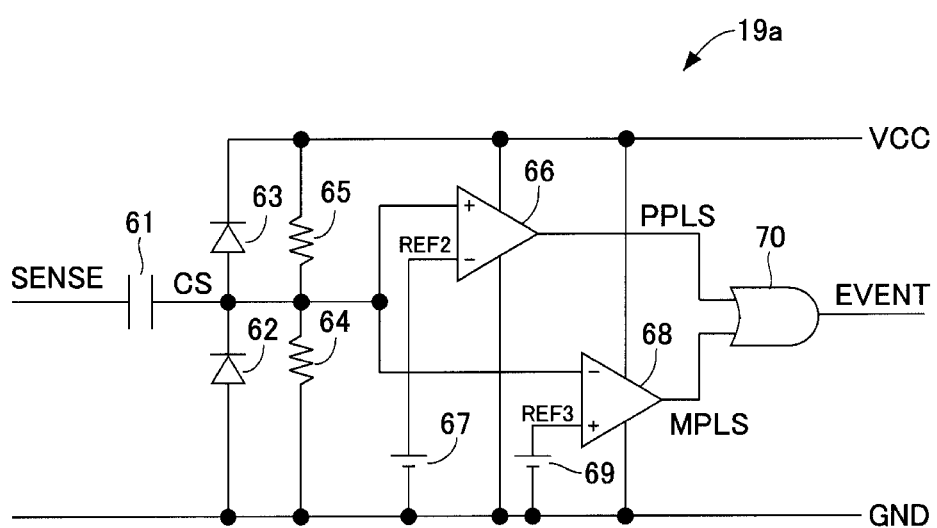
FIG. 8 is a circuit diagram showing a configuration example of a high side potential determination circuit of a semiconductor device according to a third embodiment.
Figure 9:
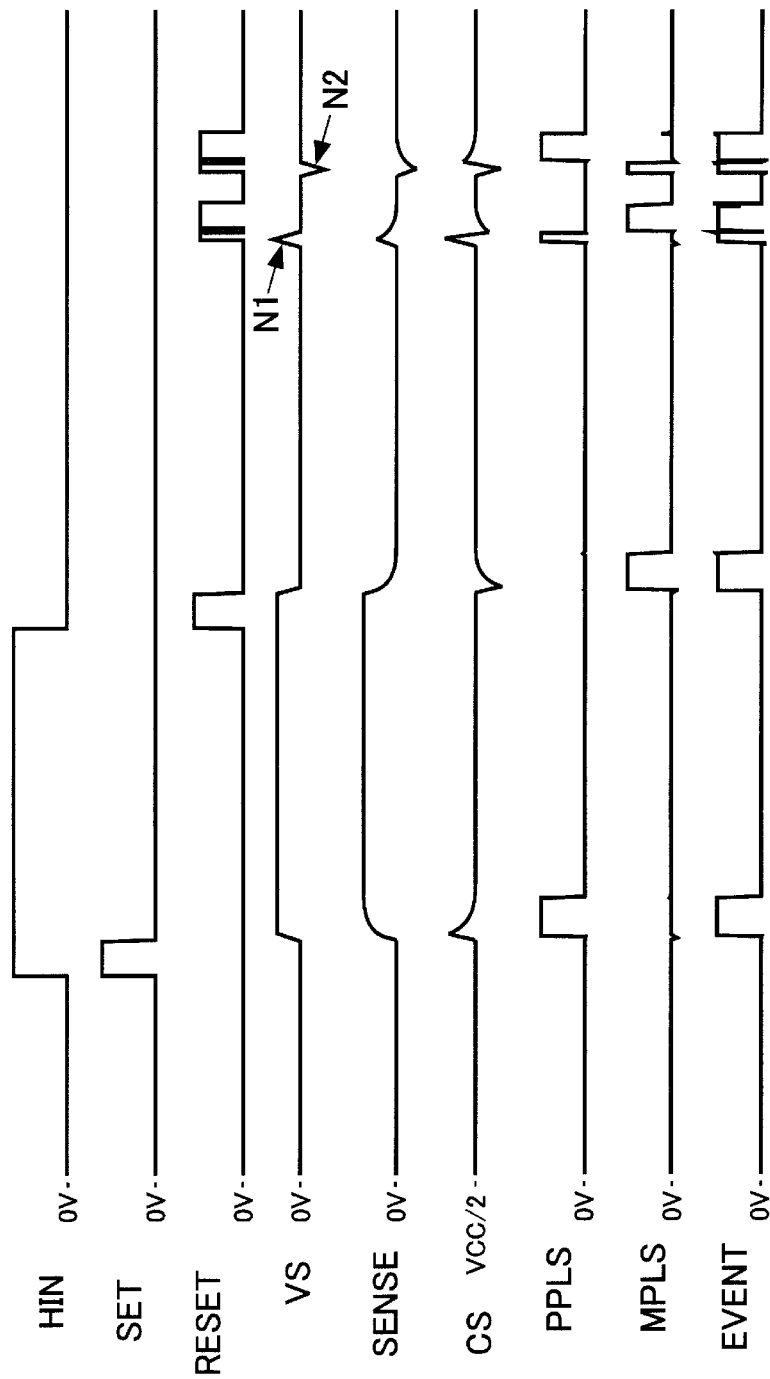
FIG. 9 is a diagram showing main portion waveforms at a time of a switching operation of the semiconductor device according to the third embodiment.

FIG. 8 is a circuit diagram showing a configuration example of a high side potential determination circuit 19*a* of a semiconductor device according to a third embodiment, and FIG. 9 is a diagram showing main portion waveforms at a time of a switching operation of the semiconductor device according to the third embodiment.

A high side potential determination circuit 19*a* has a capacitor 61 of which one end is connected to an input terminal of the detection signal SENSE. As the detection signal SENSE is input via the capacitor 61, the high side potential determination circuit 19*a* configures a ±dV/dt detector circuit (differential circuit). The other end of the capacitor 61 is connected to the cathode of a protective diode 62 and the anode of a protective diode 63, the anode of the protective diode 62 is connected to the ground GND, and the cathode of the protective diode 63 is connected to the low side power supply potential VCC. Resistors 64 and 65 are connected in parallel to the protective diode 62 and protective diode 63 respectively. A connection point of the resistors 64 and 65 is connected to one input of a comparator 66, the other input of the comparator 66 is connected to a positive electrode terminal of a reference voltage supply 67, and a negative electrode terminal of the reference voltage supply 67 is connected to the ground GND. The connection point of the resistors 64 and 65 is also connected to one input of another comparator 68, the other input of the comparator 68 is connected to a positive electrode terminal of a reference voltage supply 69, and a negative electrode terminal of the reference voltage supply 69 is connected to the ground GND. The outputs of the comparators 66 and 68 are each connected to an input of an OR circuit 70, and the output of the OR circuit 70 configures an output terminal of the event signal EVENT. The output of the high side potential detector circuit 18 of FIG. 1 or the output of the high side potential detector circuit 18a of FIG. 7 is connected to the input terminal of the detection signal SENSE.

In the high side potential determination circuit 19a with the described configuration, the potential of the terminal of the capacitor 61 on the side opposite to the input terminal of the detection signal SENSE is shown in FIG. 8 as a potential signal CS, and the low side power supply potential VCC is fixed in accordance with a potential divided by the resistors 64 and 65 when the detection signal SENSE maintains a constant value (a steady state). Also, in FIG. 9, the steady state potential signal CS is of a value that is a half of the low side power supply potential VCC. The reference voltage supply 67 of the comparator 66 has a reference potential REF2, and the reference voltage supply 69 of the comparator 68 has a reference potential REF3, wherein the relationship is such that REF2>CS>REF3.

Therefore, when no change in the detection signal SENSE is input into the input terminal, the comparator 66 outputs an output signal PPLS at the L level, while the comparator 68 outputs an output signal MPLS at the L level. Therefore, the output of the OR circuit 70 outputs the event signal EVENT at the L level.

Herein, as shown in FIG. 9, the set signal SET is output in response to the rise of the high side control logic input signal HIN, and on the high side power device HQ switching to an on-state accordingly, the high side reference potential VS changes to the plus side. The change in the high side reference potential VS is detected by the high side potential detector circuit 18 or 18a, and input as the detection signal SENSE into the high side potential determination circuit 19a. At this time, as the high side reference potential VS changes in an upward direction, the potential signal CS is of a waveform on which a differential (dV/dt) signal changed to the plus side is superimposed. The comparator 66, which detects a change to the plus side, detects the change in the potential signal CS and outputs the output signal PPLS at the H level, which is output from the OR circuit 70 as the event signal EVENT.

The reset signal RESET is output in response to the fall of the high side control logic input signal HIN, and on the high side power device HQ switching to an off-state accordingly, the high side reference potential VS changes to the minus side. The change in the high side reference potential VS is detected by the high side potential detector circuit 18 or 18a, and input as the detection signal SENSE into the high side potential determination circuit 19a. At this time, as the high side reference potential VS changes in a downward direction, the potential signal CS is of a waveform on which a differential signal changed to the minus side is superimposed. The comparator 68, which detects a change to the minus side, detects the change in the potential signal CS and outputs the output signal MPLS at the H level, which is output from the OR circuit 70 as the event signal EVENT.

When the high side control logic input signal HIN is at the L level, that is, when the high side power device HQ is in an off-state, the comparators 66 and 68 detect the ±dV/dt of the potential signal CS even when external noises N1 and N2 are superimposed on the high side reference potential VS. The detected output signals PPLS and MPLS are subjected to a logical sum operation, and output as the event signal EVENT.

Figure 10:
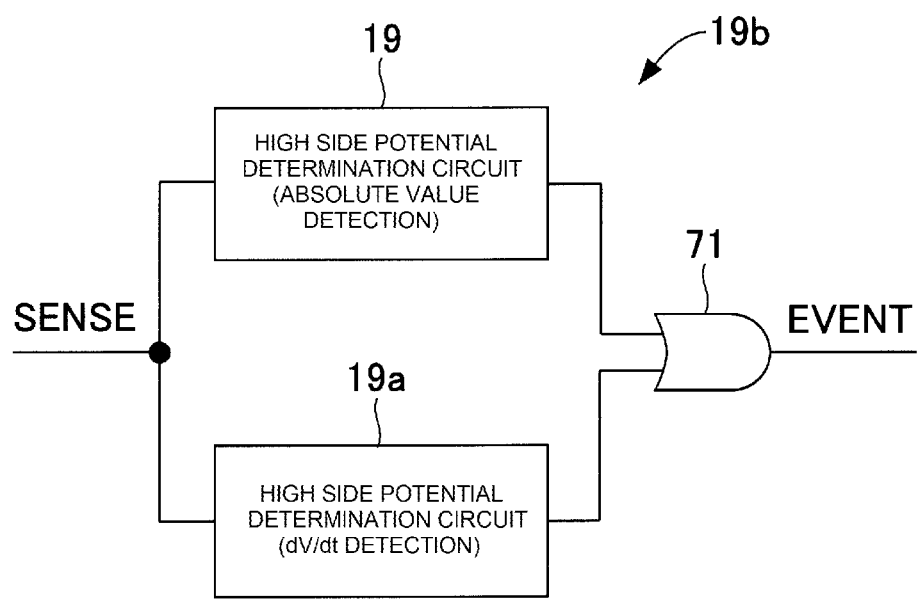
FIG. 10 is a circuit diagram showing a configuration example of a high side potential determination circuit of a semiconductor device according to a fourth embodiment.

FIG. 10 is a circuit diagram showing a configuration example of a high side potential determination circuit of a semiconductor device according to a fourth embodiment.

A high side potential determination circuit 19b is configured by combining the high side potential determination circuit 19 of FIG. 4 and the high side potential determination circuit 19a of FIG. 8. That is, an input terminal of the detection signal SENSE is connected to the inputs of the high side potential determination circuits 19 and 19a, while the outputs of the high side potential determination circuits 19 and 19a are each connected to an input of an OR circuit 71. The output of the OR circuit 71 configures an output terminal of the high side potential determination circuit 19b, and outputs the event signal EVENT.

By combining the high side potential determination circuit 19 and high side potential determination circuit 19a, the high side potential determination circuit 19b can have combined characteristics of the high side potential determination circuit 19 and high side potential determination circuit 19a. The high side potential determination circuit 19 detects the high side reference potential VS directly by the absolute value thereof, because of which, while it can be reliably be confirmed that the high side reference potential VS is changing, there is a possibility of operating delay occurring due to the resistance value or internal parasitic capacitance. Meanwhile, as the high side potential determination circuit 19a detects only voltage change, a change in the high side reference potential VS can be swiftly detected. Consequently, the high side potential determination circuit 19b can detect a change in the high side reference potential VS promptly and reliably.

In the example shown, the high side potential determination circuit 19b is such that the OR circuit 71 is disposed for the outputs of the high side potential determination circuit 19 and high side potential determination circuit 19a, but configuring with an AND circuit is also possible.

In the described embodiments, when the high side power device HQ in an on-state cannot be controlled so as to switch to an off-state, the high side power device HQ is reliably controlled so as to switch to an off-state by regenerating the reset signal RESET. Hereafter, a description will be given of an example wherein not only is the reset signal RESET regenerated, but the set signal SET can be regenerated when the high side power device HQ in an off-state cannot be switched to an on-state.

Figure 11:
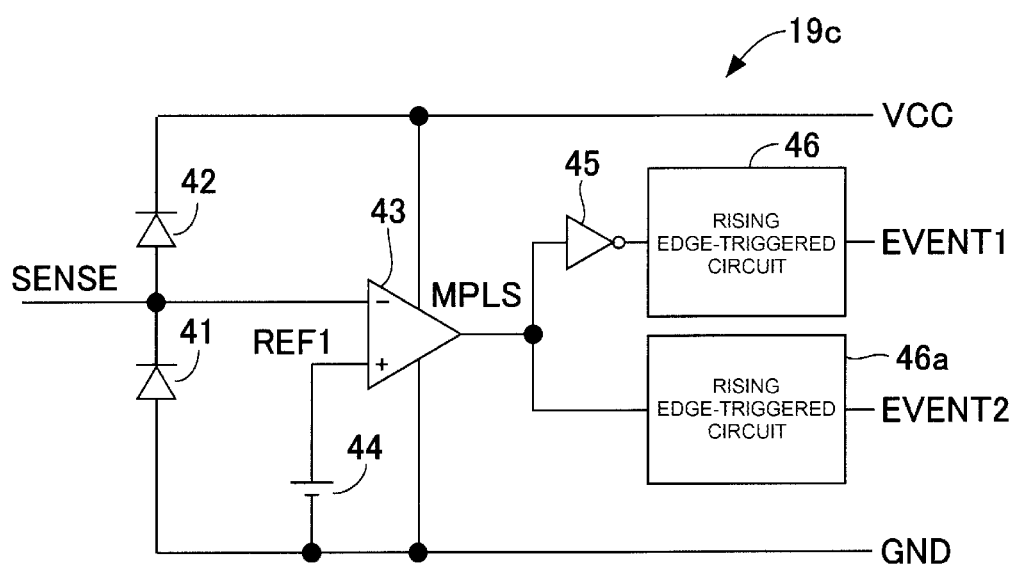
FIG. 11 is a circuit diagram showing a configuration example of a high side potential determination circuit of a semiconductor device according to a fifth embodiment.
Figure 12:
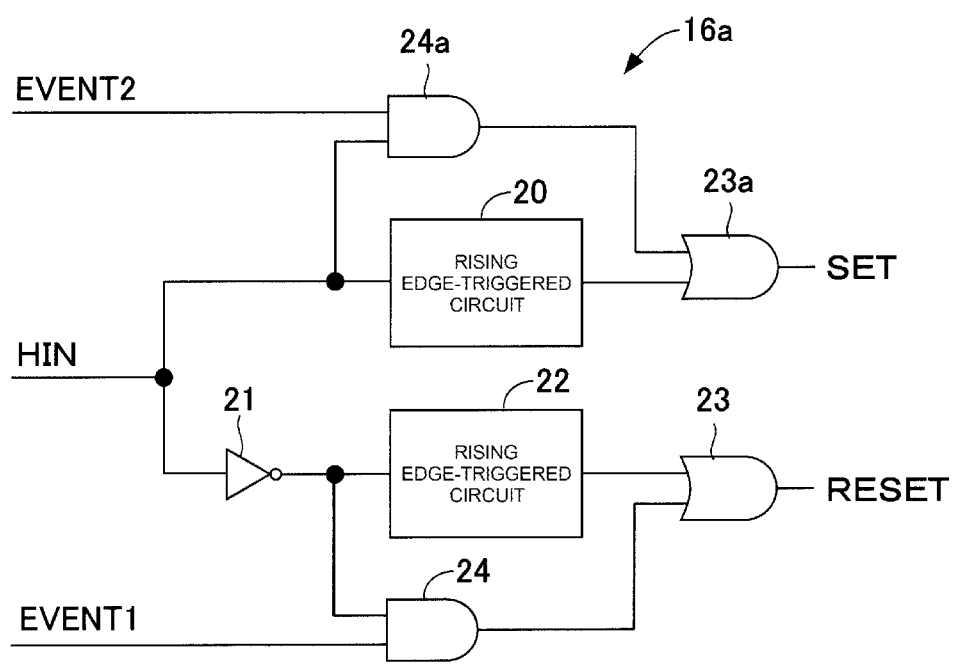
FIG. 12 is a circuit diagram showing a configuration example of a pulse generator circuit of the semiconductor device according to the fifth embodiment.
Figure 13:
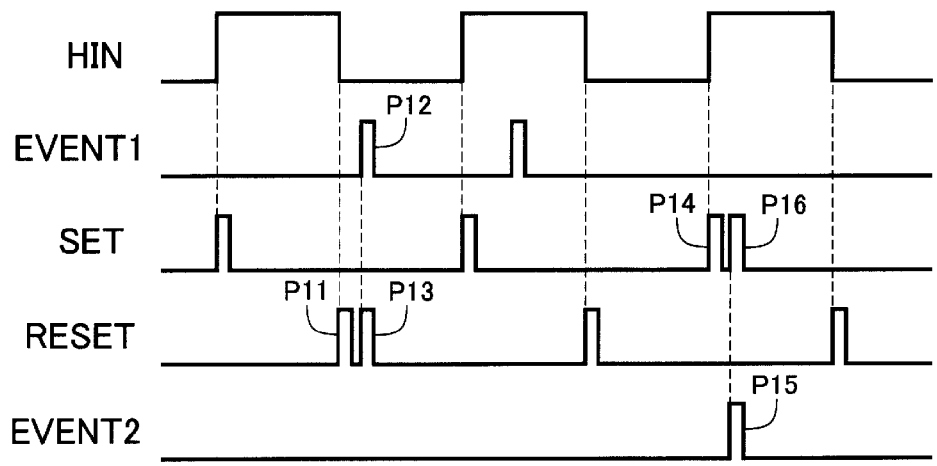
FIG. 13 is a diagram showing main portion operation waveforms of the semiconductor device according to the fifth embodiment.

FIG. 11 is a circuit diagram showing a configuration example of a high side potential determination circuit of a semiconductor device according to a fifth embodiment, FIG. 12 is a circuit diagram showing a configuration example of a pulse generator circuit of the semiconductor device according to the fifth embodiment, and FIG. 13 is a diagram showing main portion operation waveforms of the semiconductor device according to the fifth embodiment. In FIG. 11 and FIG. 12, the same reference signs are given to components the same as or equivalent to components shown in FIG. 4 and FIG. 2.

In the semiconductor device according to the fifth embodiment, the high side potential determination circuit 19 and pulse generator circuit 16 of the semiconductor device according to the first embodiment shown in FIG. 1 are changed to a high side potential determination circuit 19c and pulse generator circuit 16a respectively.

The high side potential determination circuit 19c is such that a rising edge-triggered circuit 46a is added to the high side potential determination circuit 19 shown in FIG. 4, as shown in FIG. 11. That is, the input of the rising edge-triggered circuit 46a is connected to the output of the comparator 43, the output of the rising edge-triggered circuit 46 forms an output terminal of an event signal EVENT1, and the output of the rising edge-triggered circuit 46a forms an output terminal of an event signal EVENT2. Also, the rising edge-triggered circuit 46 and rising edge-triggered circuit 46a have the same circuit configuration as the rising edge-triggered circuit 20 shown in FIG. 3.

The pulse generator circuit 16a is such that an OR circuit 23a and an AND circuit 24a are added to the pulse generator circuit 16 shown in FIG. 2, as shown in FIG. 12. That is, one input of the AND circuit 24a is connected to an input terminal of the high side control logic input signal HIN, the other input is connected to an input terminal of the event signal EVENT2, and the output is connected to one input of the OR circuit 23a. The other input of the OR circuit 23a is connected to the output of the rising edge-triggered circuit 20, while the output configures an output terminal of the set signal SET. One input of the AND circuit 24 is connected to an input terminal of the event signal EVENT1.

The described configuration is such that operation is the same as in the described embodiments when the high side power device HQ does not shift to an off-state despite the rising edge-triggered circuit 22, with the falling edge of the high side control logic input signal HIN as a trigger, generating the reset signal RESET (a pulse P11 of FIG. 13). That is, the high side potential determination circuit 19c determines that the high side reference potential VS is in a dropped state, which is the cause of the reset signal RESET not being transmitted to the high side drive circuit 12, and outputs the event signal EVENT1 (a pulse P12 of FIG. 13). The pulse generator circuit 16a receives the event signal EVENT1, and regenerates the reset signal RESET (a pulse P13 of FIG. 13).

Next, a description will be given of a case wherein the high side power device HQ does not shift to an on-state despite the rising edge-triggered circuit 20, with the rising edge of the high side control logic input signal HIN as a trigger, generating the set signal SET (a pulse P14 of FIG. 13). In this case too, the cause is that external noise is superimposed on the high side reference potential VS when the set signal SET is generated, and the set signal SET is not transmitted normally to the high side drive circuit 12. On the high side potential detector circuit 18 detecting a change in potential caused by a change in the high side reference potential VS in response to the set signal SET is generated, or more specifically, on the set signal SET being generated, and a contrary fall being detected although the high side reference potential VS has to rise, the rising edge-triggered circuit 46a of the high side potential determination circuit 19c generates the event signal EVENT2 (a pulse P15 of FIG. 13). The pulse generator circuit 16a, which receives the event signal EVENT2, is such that, as the high side control logic input signal HIN is at the H level, the AND circuit 24a outputs an H level signal, and this is output again from the OR circuit 23a as the set signal SET (a pulse P16 of FIG. 13). Therefore, the high side power device HQ is shifted to an on-state.

Figure 14:
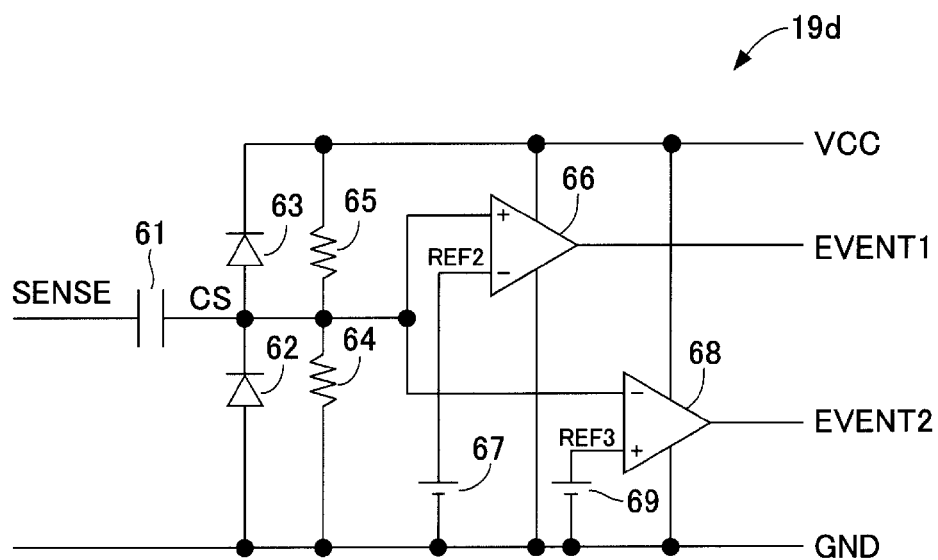
FIG. 14 is a circuit diagram showing a configuration example of a high side potential determination circuit of a semiconductor device according to a sixth embodiment.
Figure 15:
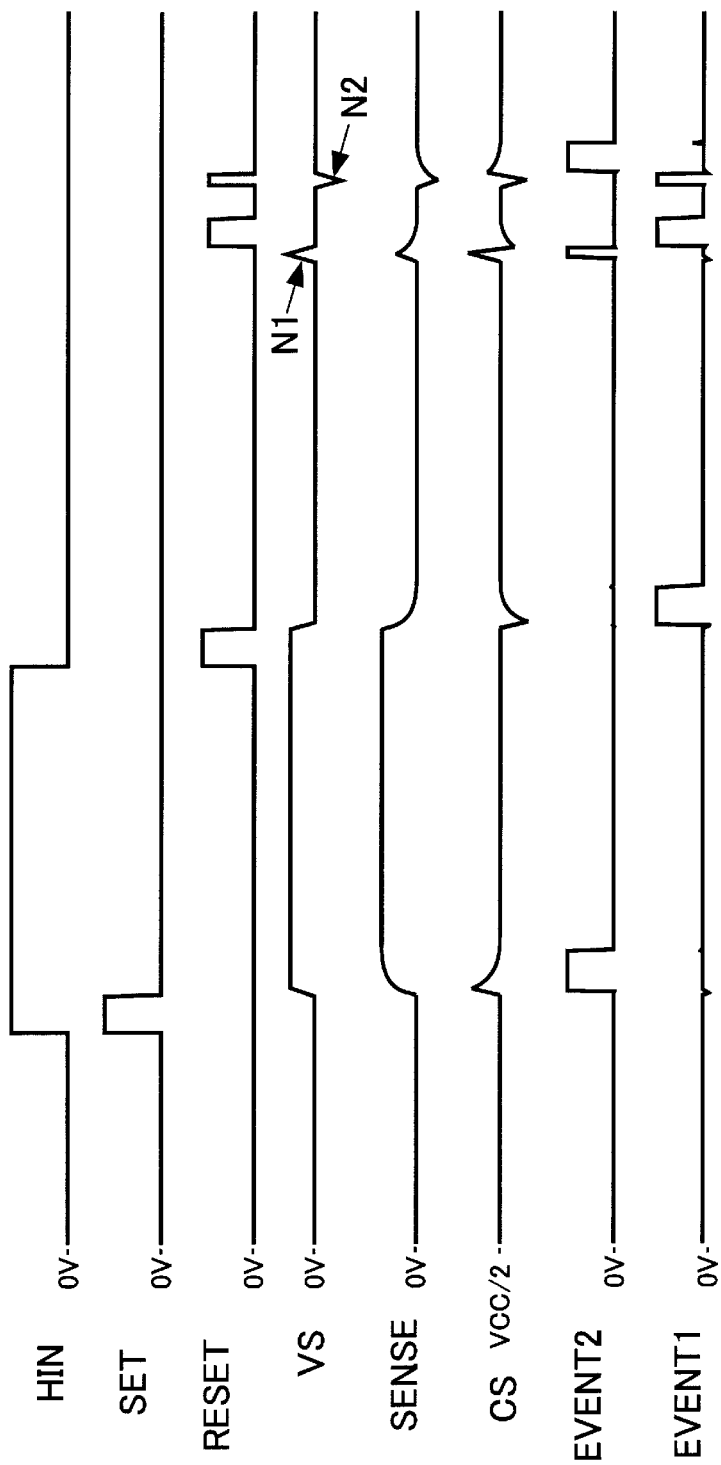
FIG. 15 is a diagram showing main portion operation waveforms of the semiconductor device according to the sixth embodiment.

FIG. 14 is a circuit diagram showing a configuration example of a high side potential determination circuit of a semiconductor device according to a sixth embodiment, and FIG. 15 is a diagram showing main portion operation waveforms of the semiconductor device according to the sixth embodiment. In FIG. 14, the same reference signs are given to components the same as or equivalent to components shown in FIG. 8.

The semiconductor device according to the sixth embodiment is such that the high side potential determination circuit 19a of the semiconductor device according to the third embodiment shown in FIG. 8 is changed to a high side potential determination circuit 19d, where regeneration of the set signal SET is also possible in addition to regeneration of the reset signal RESET. In order to do this, the output of the comparator 66 is adopted as an output terminal of the event signal EVENT1, and the output of the comparator 68 is adopted as an output terminal of the event signal EVENT2.

When no changed detection signal SENSE is input into the input terminal, the comparator 66 outputs the event signal EVENT1 at the L level, while the comparator 68 outputs the event signal EVENT2 at the L level.

In this state, as shown in FIG. 15, the set signal SET is output in response to the rise of the high side control logic input signal HIN, and on the high side power device HQ switching to an on-state, the high side reference potential VS changes to the plus side. The change in the high side reference potential VS is detected by the high side potential detector circuit 18 or 18a, and input as the detection signal SENSE into the high side potential determination circuit 19d. At this time, as the high side reference potential VS changes in an upward direction, the potential signal CS is of a waveform on which a differential signal changed to the plus side is superimposed. The comparator 66, which detects a change to the plus side, detects the change in the potential signal CS and outputs the event signal EVENT 1 at the H level.

On the reset signal RESET being output in response to the fall of the high side control logic input signal HIN, the high side power device HQ switches to an off-state, and the high side reference potential VS changes to the minus side. The change in the high side reference potential VS is detected by the high side potential detector circuit 18 or 18a, and input as the detection signal SENSE into the high side potential determination circuit 19d. At this time, as the high side reference potential VS changes in a downward direction, the potential signal CS is of a waveform on which a differential signal changed to the minus side is superimposed. The comparator 68, which detects a change to the minus side, detects the change in the potential signal CS and outputs the event signal EVENT2 at the H level.

When the external noises N1 and N2 are superimposed on the high side reference potential VS, the comparators 66 and 68 detect the ±dV/dt of the potential signal CS, and output the event signals EVENT1 and EVENT2. In FIG. 15, as the high side control logic input signal HIN is maintaining the L level, the reset signal RESET is regenerated in response to the event signal EVENT2, but herein, it may happen that the event signal EVENT2 is output (corresponding to the pulse P15 of FIG. 13) when the high side control logic input signal HIN is at the L level, that is, when the high side power device HQ is in an off-state, and the high side control logic input signal HIN shifts to the H level at this timing. In this case, the pulse generator circuit 16 regenerates the set signal SET.

Heretofore, a description has been given of embodiments of the disclosure but, the disclosure is not limited by these specific examples, it goes without saying that various changes and modifications are possible without departing from the spirit of the disclosure. For example, the semiconductor device according to the fourth embodiment is such that the two high side potential determination circuits 19 and 19*a* receive the same detection signal SENSE. However, the configuration may be such that one of the high side potential determination circuits 19 and 19*a* receives the output of the high side potential detector circuit 18 of FIG. 1, while the other receives the output of the high side potential detector circuit 18*a* of FIG. 7. In addition, the disclosure can be implemented by appropriately combining components of a multiple of embodiments within a consistent range.

The description heretofore shows simply the principle of the disclosure. Furthermore, a large number of modifications and changes being possible for those skilled in the art, the disclosure is not limited to the exact configurations and application examples shown and described, but rather all corresponding modification examples and equivalents are seen as being within the scope of the disclosure according to the attached claims and equivalents.

What is claimed is:

1. A drive circuit, comprising:
   a high side drive circuit that drives a high side power device;
   a pulse generator circuit that generates
      a set signal causing the high side power device to be turned on based on a first edge of a logic input signal, and
      a reset signal causing the high side power device to be turned off based on a second edge of the logic input signal;
   a level shift circuit that provides the set signal and reset signal to the high side drive circuit;
   a high side potential detector circuit that detects high side potential; and
   a high side potential determination circuit that provides an event signal based on a change in the high side potential detected by the high side potential detector circuit, wherein
   the pulse generator circuit regenerates the reset signal based on the event signal provided by the high side potential determination circuit, and the logic input signal.

2. The drive circuit of claim 1, wherein
   the pulse generator circuit regenerates the reset signal in response to the event signal being generated during an abnormal state of the drive circuit.

3. The drive circuit of claim 1, wherein
   the event signal is output, with the first edge of the logic input signal as a trigger, based on a change in the high side potential in a first direction.

4. The drive circuit of claim 1, wherein
   the high side potential is a high side reference potential or a high side power supply potential.

5. The drive circuit of claim 1, wherein
   the high side potential detector circuit includes a resistant field plate having electrical field relaxation in a high side circuit high withstand voltage region.

6. The drive circuit of claim 1, wherein
   the high side potential detector circuit includes a bipolar transistor configured to switch to an on-state or off-state in response to a change in the high side potential, the high side potential having a low side reference potential as a boundary.

7. The drive circuit of claim 1, wherein
   the high side potential determination circuit is disposed on a low side reference potential side having ground potential as a reference.

8. The drive circuit of claim 1, wherein
   the high side potential determination circuit includes at least one of
      a first circuit that determines a malfunction of the level shift circuit based on the absolute value of the high side potential and
      a second circuit that determines a malfunction of the level shift circuit based on the dV/dt of the high side potential.

9. The drive circuit of claim 8, wherein
   the first circuit includes
      a comparator that compares a potential corresponding to the high side potential detected by the high side potential detector circuit with a predetermined reference potential, and
      an edge-triggered circuit that provides the event signal having a predetermined duration based on a first edge of an output signal of the comparator.

10. The drive circuit of claim 8, wherein
    the first circuit includes
       a comparator that compares a potential corresponding to the high side potential detected by the high side potential detector circuit with a predetermined reference potential,
       a first edge-triggered circuit that provides a first event signal having a predetermined duration based on a first edge of an output signal of the comparator, and
       a second edge-triggered circuit that provides a second event signal having a predetermined duration based on a first edge of a signal that is an inversion of the output signal of the comparator.

11. The drive circuit of claim 8, wherein
    the second circuit includes
       a capacitor that provides a changing potential corresponding to the high side potential detected by the high side potential detector circuit,
       a first comparator that compares the changing potential corresponding to the high side potential provided via the capacitor with a predetermined first reference potential,
       a second comparator that compares the changing potential corresponding to the high side potential provided via the capacitor with a predetermined second reference potential, and
       a circuit that performs a logical operation on an output of the first comparator and an output of the second comparator, and
       provides the event signal.

12. The drive circuit of claim 8, wherein
    the second circuit includes
       a capacitor that provides a changing potential corresponding to the high side potential detected by the high side potential detector circuit,
       a first comparator that
          compares the changing potential corresponding to the high side potential provided via the capacitor with a predetermined first reference potential and provides a first event signal, and a second comparator that
    compares the changing potential corresponding to the high side potential provided via the capacitor with a predetermined second reference potential and
    provides a second event signal.

13. The drive circuit of claim 1, wherein
the pulse generator circuit generates the set signal and reset signal based on the logic input signal, the logic input signal having priority over the generation of the set signal or reset signal, based on the event signal.

14. A semiconductor device comprising the drive circuit of claim 1.

15. The drive circuit of claim 1, wherein
the logic input signal is generated externally from the drive circuit.

16. The drive circuit of claim 5, wherein
a first node of the resistant field plate is connected to the high side potential,
a second node of the resistant field plate is connected to a low side reference potential, and
an intermediate node of the resistant field plate is an output terminal.

17. A drive circuit, comprising:
a high side drive circuit configured to drive a high side power device;
a pulse generator circuit configured to generate
    a set signal causing the high side power device to be turned on based on a first edge of a logic input signal, and
    a reset signal causing the high side power device to be turned off based on a second edge of the logic input signal;
a level shift circuit configured to provide the set signal and reset signal to the high side drive circuit;
a high side potential detector circuit configured to detect high side potential; and
a high side potential determination circuit configured to provide an event signal based on a change in the high side potential detected by the high side potential detector circuit,
wherein the pulse generator circuit is configured to regenerate the reset signal based on the event signal provided by the high side potential determination circuit, and the logic input signal.

* * * * *